US006480045B2

(12) United States Patent
Albean

(10) Patent No.: US 6,480,045 B2
(45) Date of Patent: Nov. 12, 2002

(54) DIGITAL FREQUENCY MULTIPLIER

(75) Inventor: David Lawrence Albean, Indianapolis, IN (US)

(73) Assignee: Thomson Licensing S.A., Boulogne (FR)

(*) Notice: Subject to any disclaimer, the term of this patent is extended or adjusted under 35 U.S.C. 154(b) by 0 days.

(21) Appl. No.: 09/755,439

(22) Filed: Jan. 5, 2001

(65) Prior Publication Data

US 2002/0089358 A1 Jul. 11, 2002

(51) Int. Cl.[7] .............................................. H03B 19/00
(52) U.S. Cl. .......................... 327/119; 327/116; 327/121
(58) Field of Search ................................. 327/119, 120, 327/121, 122, 116, 291; 377/47

(56) References Cited

U.S. PATENT DOCUMENTS

| | | | |
|---|---|---|---|
| 3,673,391 A | 6/1972 | Lougheed | 235/150.3 |
| 3,828,169 A | 8/1974 | Fluet | 235/150.31 |
| 3,883,817 A | 5/1975 | Cliff | 331/1 A |
| 4,339,722 A | 7/1982 | Sydor et al. | 328/38 |
| 5,321,734 A * | 6/1994 | Ogata | 377/47 |
| 5,422,835 A * | 6/1995 | Houle et al. | 364/703 |
| 5,530,387 A * | 6/1996 | Kim | 327/119 |
| 5,614,841 A | 3/1997 | Marbot et al. | 326/52 |
| 5,786,715 A * | 7/1998 | Halepete | 327/116 |
| 5,821,785 A | 10/1998 | Glass et al. | 327/116 |
| 5,933,035 A * | 8/1999 | Bezzant et al. | 327/116 |
| 6,008,676 A | 12/1999 | Lee et al. | 327/122 |
| 6,118,313 A * | 9/2000 | Yakabe et al. | 327/116 |
| 6,259,283 B1 * | 7/2001 | Nguyen | 327/122 |

* cited by examiner

Primary Examiner—Timothy P. Callahan
Assistant Examiner—Hai L. Nguyen
(74) Attorney, Agent, or Firm—Robert D. Shedd; Joseph S. Tripoli

(57) ABSTRACT

A digital frequency multiplier provides non-integer frequency multiplication of an input signal. A multiplexer receives the input signal and an integer multiple of the input signal. A multiplexer control signal selects/toggles which signal the multiplexer will output and how long. A counter, clocked by one of the signals, provides the multiplexer control signal. The multiplexer outputs a pre-determined number of clock cycles of each signal to produce the desired non-integer frequency multiplied input signal. The present invention generates frequency multiplication without a phase locked loop (PLL).

20 Claims, 3 Drawing Sheets

DIGITAL FREQUENCY MULTIPLIER

FIELD OF THE INVENTION

The present invention relates to frequency multipliers and, more particularly to a digital frequency multiplier for generating non-integer multiples of a reference frequency.

BACKGROUND OF THE INVENTION

Various types of electronic circuits, such as integrated circuits (ICs), utilize/require clock signals or signals of different frequencies for operation of the different sections of circuitry or logic. In the case of ICs, many designs require several multiples (or sub-multiples) of a reference signal to clock blocks or sections of on-chip circuitry or logic. Rather than provide each different frequency reference signal to the IC from an external source, it is preferable to generate the different frequency signals on the IC utilizing a single input or reference signal. This eliminates the need to utilize an input/output (I/O) pin for every input signal.

If the frequencies of the required on-chip signals are greater than the frequency of the input/reference signal, often and typically a phase locked loop (PLL) configured as a frequency synthesizer is employed to generate the on-chip signals of the required frequencies. However, such a PLL is a relatively complex block of analog circuitry.

In FIG. 1, there is shown a block diagram representation of a prior art analog phase locked loop (PLL) circuit, generally designated 10, that is configured as an analog frequency synthesizer. In particular, the PLL 10 is operable to generate an output signal of a frequency that is a multiple of a frequency of an input signal. Operation of the prior art analog PLL 10 is described below.

An input signal $f_{in}$ of a particular frequency is input to a divide by M block 12 of appropriate analog circuitry, where M is any whole number. This results in a signal of $f_{in}/M$ frequency at an output of the divide by M block 12. The $f_{in}/M$ frequency signal is input into an analog phase detector 14. An output signal of the phase detector 14 is input into an analog low-pass filter 16. The output signal of the low-pass filter 16 is input to an analog voltage controlled oscillator (VCO) 18. An output signal of the VCO 18 is used as an input to drive a divide by N block 20 also characterized by appropriate analog where N is any whole number. An output signal of the divide by N block 20 is used to as an input to the phase detector 14 to complete a signal loop. As well, an output signal of the VCO 18 is input into an analog buffer 22. An output signal $f_{out}$ of the buffer 22 is the signal $f_{in}$ multiplied by N/M (i.e. $f_{out}=f_{in}(N/M)$).

The prior art analog PLL 10 as depicted in FIG. 1, while operable to generate an output signal having a frequency that is a fractional multiple of a frequency of an input signal is implemented by analog circuitry. Analog circuitry is not particularly compatible with digital circuitry such as in ICs. Additionally, analog circuitry takes up much needed space in an IC when so implemented. When an analog PLL is provided in an IC, such analog circuitry requires several dedicated I/O pins on the IC for a discrete loop filter and for the programmability of the M and N parameters. As well, typical digital gate array ICs require a separate discrete PLL chip or section for generating higher frequency clock signals from an input clock signal. An analog PLL will also draw a quiescent current.

SUMMARY OF THE INVENTION

The present invention is digital frequency multiplier that is operable to generate an output signal of a frequency that is a non-integer multiple of a frequency of an input/reference signal. The digital frequency multiplier is operable to synthesize an output signal having a frequency that is an over-unity, non-integer multiple of a frequency of an input signal.

In one form, the present invention is a digital frequency multiplier having frequency multiplying means, signal selection means, and control means. The frequency multiplying means is operable to receive an input signal of a given frequency and generate an intermediate signal of a frequency that is an integer multiple of the given frequency of the input signal. The signal selection means is in communication with the frequency multiplying means and is operable to receive the input signal and the intermediate signal and selectively output the input signal for a first predetermined period of time and the intermediate signal for a second predetermined period of time in response to a control signal to generate an output signal having a frequency that is a non-integer multiple of the given frequency of the input signal. The control means is in communication with the signal selection means and is operable to generate the control signal and provide the control signal to the signal selection means.

In another form, the present invention is a digital frequency multiplier having a frequency multiplier unit, a multiplexer, and a control signal generator. The frequency multiplier unit is operable to generate an intermediate signal having a frequency that is an integer multiple of a frequency of an input signal. The multiplexer has a first input in communication with the frequency multiplier unit to receive the intermediate signal, and a second input to receive the input signal. The multiplexer is configured to output the intermediate signal for a predetermined period of time in response to a control signal of a first state, and output the input signal for a predetermined period of time in response to a control signal of a second state, wherein the selective outputting of the intermediate signal and the input signal results in an output signal of a frequency that is a non-integer multiple of the input signal. The control signal generator is in communication with the multiplexer and is operable to generate the control signal of the first state and the control signal of the second state.

In yet another form, the present invention is a method of generating an output signal of a frequency that is a non-integer multiple of a frequency of an input signal. The method includes the step of: digitally generating an intermediate signal of a frequency that is an integer multiple of the frequency of the input signal; determining a first number of clock cycles of the input signal and a second number of clock cycles of the intermediate signal that, when combined, generate an output signal of a frequency that is the non-integer multiple of the frequency of the input signal; digitally generating a control signal indicative of the first number of clock cycles and the second number of clock cycles; and digitally selectively outputting the input signal for the first number of clock cycles and the intermediate signal for the second number of clock cycles in response to the control signal, whereby the selective outputting of the input signal and the intermediate signal results in an output signal of a frequency that is a non-integer multiple of the frequency of the input signal.

BRIEF DESCRIPTION OF THE DRAWINGS

Reference to the following description of the present invention should be taken in conjunction with the accompanying drawings, wherein.

Corresponding reference characters indicate corresponding parts throughout the several views.

DETAILED DESCRIPTION OF THE INVENTION

Figure 1:
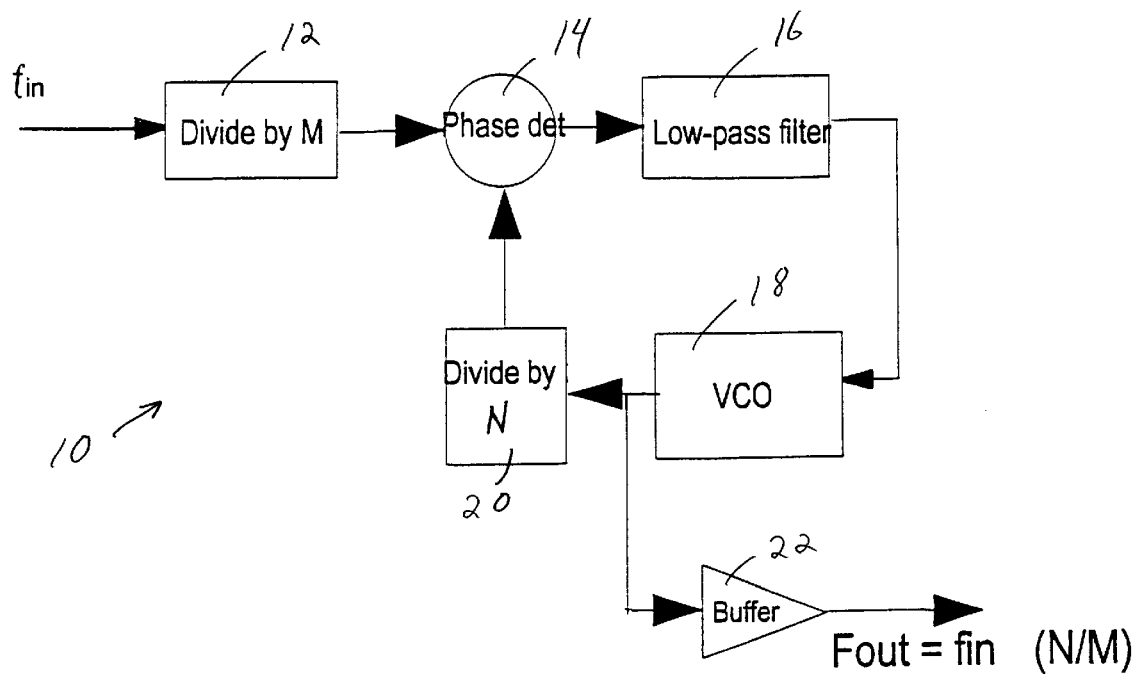
FIG. 1 is a block diagram of a prior art analog phase lock loop circuit.
Figure 2:
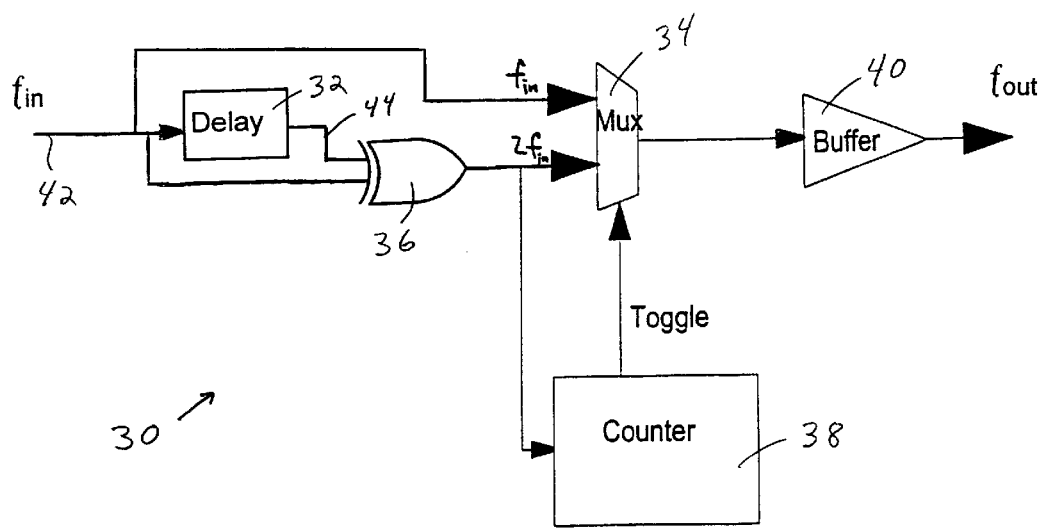
FIG. 2 is a block diagram of a digital frequency multiplier in accordance with the principles of the present invention.

With reference to FIG. 2, there is depicted a block diagram of an embodiment of a digital frequency multiplier generally designated 30 in accordance with the principles presented herein. The digital frequency multiplier 30 is operable to generate an output signal $f_{out}$ that has a frequency which is related to a frequency of an input signal $f_{in}$. According to one aspect, the digital frequency multiplier 30 is operable to generate an output signal $f_{out}$ that is a multiple of the frequency of the input signal $f_{in}$. According to another aspect, the digital frequency multiplier synthesizer 30 is operable to generate an output signal $f_{out}$ that is a non-integer multiple of the frequency of the input signal $f_{in}$. According to yet another aspect, the digital frequency multiplier 30 is operable to generate an output signal $f_{out}$ that is an over-unity, non-integer multiple of the frequency of the input signal $f_{in}$.

Stated in other terms, the digital frequency multiplier 30 is operable to multiply an input frequency $f_{in}$ by an over-unity, non-integer number. In one form, the output signal $f_{out}$ has a frequency that is also below an over-unity integer multiple of the frequency of the input signal $f_{in}$. In one form, the digital frequency multiplier 30 is operable to generate an output signal $f_{out}$ having a frequency that is between the frequency of the input signal $f_{in}$ and twice the frequency of the input signal $f_{in}$.

The digital frequency multiplier 30 receives an input signal $f_{in}$ on an input line or terminal 42. The input signal $f_{in}$ can be any particular frequency but less than a desired frequency of an output signal $f_{out}$. The input signal $f_{in}$ is input to a delay section 32. The delay section 32 is operable to introduce a delay factor or time to the input signal $f_{in}$ via appropriate circuitry and/or logic. The delay time introduced to the input signal $f_{in}$ by the delay section 32 creates a delayed output signal on line 44. The delayed output signal on line 44 is input to one input of a two-input exclusive OR (X-OR) gate or like-function component 36. The input signal $f_{in}$ is input to the other input of the two-input X-OR gate 36. The X-OR gate 36 creates a new frequency signal that is an intermediate product or process signal that is used in conjunction with the input signal $f_{in}$ for generating the new or output signal $f_{out}$.

The delay section 32 and the X-OR gate 36 together form a frequency multiplier unit. Specifically, the frequency multiplier unit is operable to multiply the frequency of the input signal $f_{in}$ by an integer or whole number. In the present case, the frequency multiplier unit is operable to provide a signal that is twice or two times (2×) the input signal $f_{in}$ ($2f_{in}$ or $2 \times f_{in}$). The delay factor or tau ($\tau$) of the delay section 32 determines the duty cycle of the $2f_{in}$ signal, and is typically chosen to be T/2 where T is the period of twice the input signal $f_{in}$. This creates a 50% duty cycle signal of the input signal $f_{in}$.

The $2f_{in}$ signal from the output of the two-input X-OR gate 36 is input to one input of a multiplexer (mux) or like-function component 34. Additionally, the input signal $f_{in}$ is input to another input of the multiplexer 34. The multiplexer 34 is operable output either one of the two signals at its inputs depending on the state of a multiplexer control or select signal. A multiplexer select signal of one state will provide the $f_{in}$ signal (the signal present on one input of the multiplexer 34) as the output of the multiplexer 34, while a multiplexer select signal of another state will provide the $2f_{in}$ signal (the signal present on another input of the multiplexer 34) as the output of the multiplexer 34. The duration or time period (e.g. clock cycles of the particular signal) that the multiplexer control signal is applied to the multiplexer, regardless of the state of the control signal, determines the duration or time period that the selected signal is provided at the output of the multiplexer 34. The output of the multiplexer 34 may be toggled between the two input signals as necessary as determined by the state of the multiplexer select signal in order to provide any combination of signals at the output thereof.

The output signal from the multiplexer 34, which is either the input signal $f_{in}$ or the intermediate process signal $2f_{in}$ from the frequency multiplier unit, is controlled by the multiplexer control signal as provided by a counter or like-function component 38. In particular, the counter 38 provides a signal to the multiplexer 34 at appropriate times and for an appropriate duration to toggle or switch the output of the multiplexer 34 between the $f_{in}$ signal and the $2f_{in}$ signal. The appropriate time and duration that the counter 38 provides a control signal to the multiplexer 34 is calculated as presented below and is dependent on the desired frequency of the output signal $f_{out}$. The desired frequency of the output signal $f_{out}$ is between the frequency of the input signal $f_{in}$ and the frequency of the $2f_{in}$ signal. The resulting output signal $f_{out}$ of the multiplexer 34 is fed through a clock distribution buffer 40 for the particular IC in which the present frequency multiplier is implemented. In general, ICs have clock buffers on their internal clocks since these signals typically have heavy fanouts. The output of the buffer 40 is the output signal, $f_{out}$.

The counter 38 is clocked by the $2f_{in}$ signal as output by the two-input X-OR gate 36. This allows the counter to provide a control signal to the multiplexer 34 for an appropriate number of clock cycles for both the $2f_{in}$ signal and the $f_{in}$ signal. When the counter 38 reaches a predetermined count or number of $2f_{in}$ pulses or clock counts, the counter 38 provides the control signal to the multiplexer 34. The control signal is a change of state from high to low, or low to high. The multiplexer 34 then provides either the $f_{in}$ signal or the $2f_{in}$ signal to the buffer 40 depending on whether the control signal is high or low. When the counter 38 again reaches a predetermined clock count, the counter 38 provides a control signal of the opposite state to the multiplexer 34. The multiplexer 34 then provides the other of the $f_{in}$ signal or the $2f_{in}$ signal to the buffer 40. This toggling of the multiplexer 34 occurs as necessary to provide an output signal of the required frequency by the appropriate combining of the input signal $f_{in}$ and the $2f_{in}$ signal.

Figure 3:
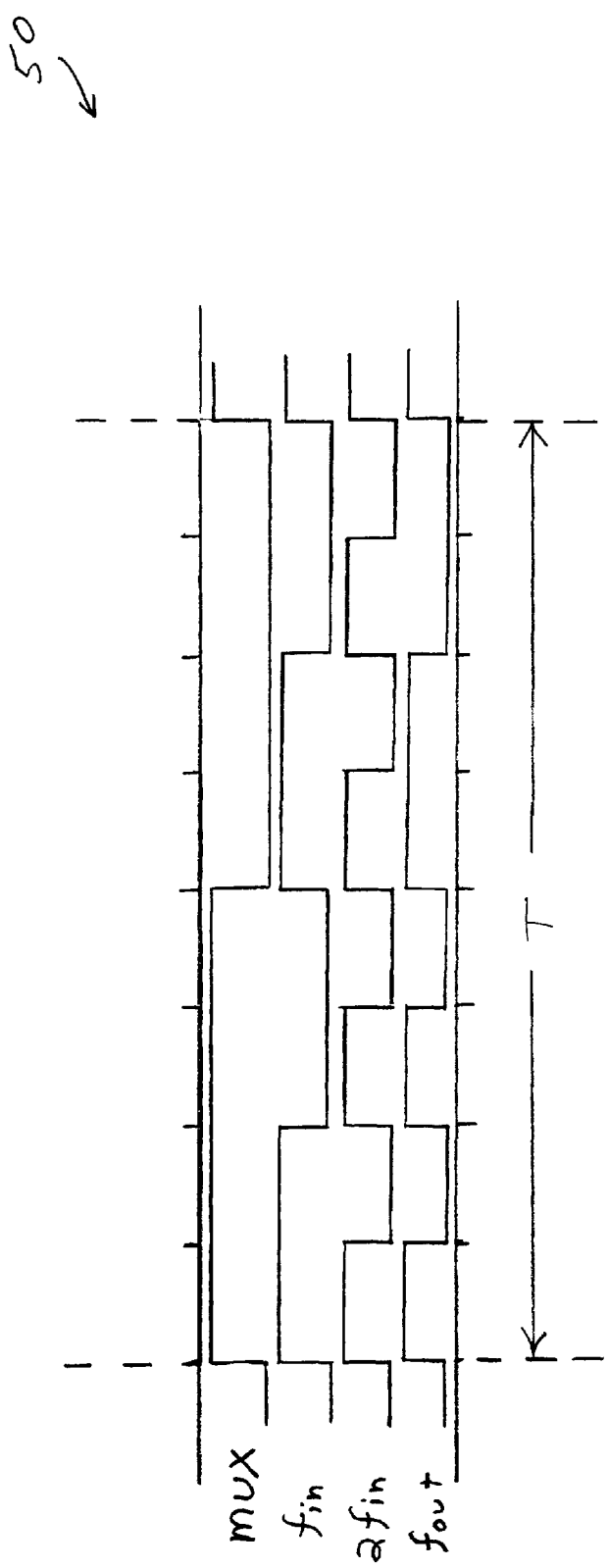
FIG. 3 is a timing diagram associated with the generation of an exemplary, arbitrarily chosen output signal that is an over-unity, non-integer multiple of a frequency of an input signal utilizing the principles of the present invention as embodied in the digital frequency multiplier of FIG. 2.

With additional reference to FIG. 3, an example of the operation of the digital frequency multiplier 30 of FIG. 2 will be described. In the present example, it will be arbitrarily assumed that a new or output clock signal ($f_{out}$) of $3/2f_{in}$ (3/2 of the frequency of the input signal) is to be generated by the digital frequency multiplier 30. It should be appreciated that the frequency of the input signal $f_{in}$ is generally arbitrary, but less than the desired new clock signal $f_{out}$. The frequency of the input signal $f_{in}$ may depend on the frequency operating range of the particular digital components of the digital frequency multiplier 30.

The input signal $f_{in}$ is input to the multiplexer 34 as well as a $2f_{in}$ signal from the X-OR gate 36. The $2f_{in}$ signal is also input to the counter 38. The $2f_{in}$ signal clocks the counter 38 and, when the counter 38 reaches a predetermined count, the control signal is sent from the counter 38 to the multiplexer 34. When the counter 38 then reaches the predetermined count again, the control signal is sent from the counter 38 to the multiplexer 34. In this manner, the two signals input to the multiplexer (i.e. $f_{in}$ and $2f_{in}$) are alternatively chosen and thus combined to form the resulting output signal $f_{out}$. Since the resulting output signal $f_{out}$ must equal $3/2f_{in}$, a minimum number of clock cycles (T) over which the correct number of clock pulses for the desired frequency occurs, must be determined. Then the number of clock cycles of each signal ($f_{in}$ and $2f_{in}$) must be determined in order to provide the resulting output signal of $3/2f_{in}$. A whole number (integer) of clock cycles is required for each signal ($f_{in}$ and $2f_{in}$).

In particular, the minimum number of clock cycles (T) is four (4). Thus T=4 clock cycles of the $2f_{in}$ signal. Within this time period, there are two (2) clock cycles of the $f_{in}$ signal and three (3) clock cycles of the $3/2f_{in}$ signal. In order to generate the multiplexer control signal that will select the proper number of $f_{in}$ and $2f_{in}$ cycles to obtain the desired new signal $f_{out}$ (where $f_{out}=3/2f_{in}$), two (2) simultaneous equations are solved for k1 (arbitrarily the total time the multiplexer control signal is high) and k2 (the total time the multiplexer control signal is low) where:

$$f_{out}=k1*(f_{in})+k2*(2f_{in}); \text{ and}$$

$$k1+k2=1.$$

The above equations become:

$$3/2f_{in}=k1*(f_{in})+k2*(2f_{in}); \text{ and}$$

$$k1+k2=1.$$

Solving the equations simultaneously yields k1=½, k2=½. Thus, the select signal is high for ½*4=2 cycles of $2f_{in}$, and low for ½*4=2 cycles of $f_{in}$. In FIG. 3, when the control or select signal (labeled MUX for the multiplexer control signal) is high, the multiplexer 34 arbitrarily selects the $2f_{in}$ signal. When the control signal (MUX) is low, the multiplexer 34 selects the $f_{in}$ signal. The counter 38 has a count value of two (2) and thus toggles the multiplexer 34 every two (2) counts of the $2f_{in}$ signal.

The count value of the counter 38 may be programmable in order for the counter 38 to produce the toggle signal for the multiplexer 34 at the appropriate times (at the count value) depending on the desired frequency of the output signal. Programmability of the counter 38 is necessary if the digital frequency synthesizer 30 is operable to provide various output signals (dynamic) in accordance with the principles presented herein. If the present digital frequency multiplier is only for a particular frequency (static), it is not necessary for the count value to change. The count value may then be unchangeable (hardwired).

The delay module and X-OR gate (frequency multiplier unit) may be replicated and cascaded to provide an output signal having a frequency higher than twice the input signal as is the case for the digital frequency multiplier circuit 30 of FIG. 2. In particular, any number of frequency multiplier units may be cascaded in order to provide an output signal of a higher frequency without having to provide a higher input signal.

Figure 4:
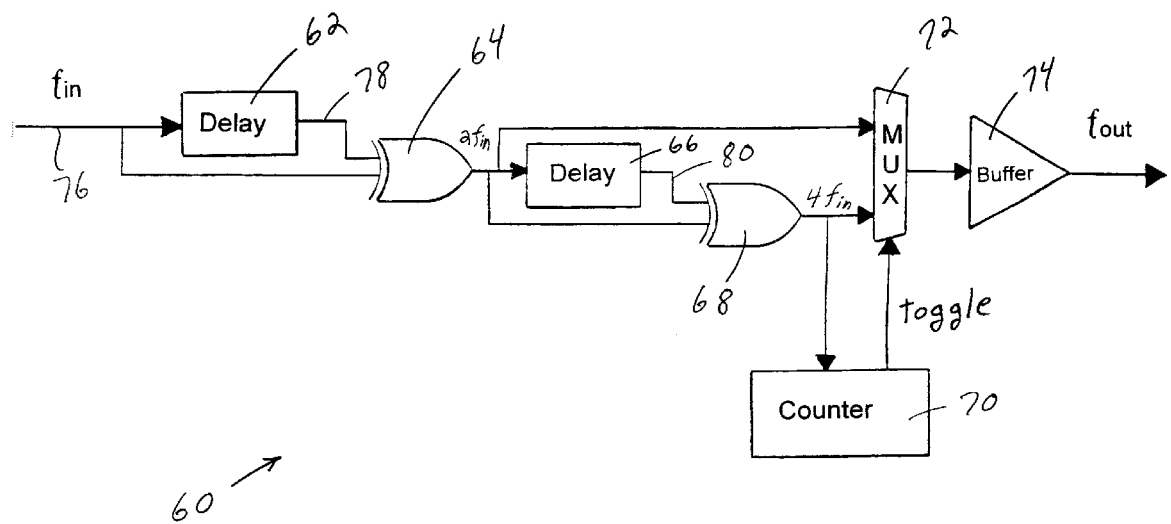
FIG. 4 is a block diagram of another embodiment of a digital frequency multiplier in accordance with the principles of the present invention.

A digital frequency multiplier circuit having cascaded frequency multiplier units, generally designated 60, is shown in FIG. 4 and reference is now made thereto. The digital frequency multiplier circuit 60 receives an input signal $f_{in}$ on an input line 76. The input signal $f_{in}$ can be any frequency, but lower than a desired output signal $f_{out}$, and is input to a delay section 62 as well as one input of a two input exclusive OR (X-OR) gate 64. The delay section 62 is operable to introduce a delay factor or time to the input signal $f_{in}$ via appropriate circuitry and/or logic. The delay time introduced to the input signal $f_{in}$ by the delay section 62 creates a delayed signal on line 78 that is input to one input of the X-OR gate 64.

The delay section 62 and the X-OR gate 64 collectively form a first frequency multiplier unit for the input signal $f_{in}$. Specifically, the frequency multiplier unit is operable to multiply the frequency of the input signal $f_{in}$ by an integer or whole number. In the present case, the frequency multiplier circuit is operable to provide a signal that is twice or two times (2×) the input signal $f_{in}$ ($2f_{in}$ or $2\times f_{in}$). The delay factor or tau ($\tau$) of the delay section 62 is typically chosen to be T/2 where T is the period of twice the input signal $f_{in}$. This creates a 50% duty cycle signal.

The $2f_{in}$ signal from the X-OR gate 64 is provided to a delay section 66 and one input of a two input X-OR gate 68. The delay section 66 is operable to introduce a delay factor or time to the input signal $2f_{in}$ via appropriate circuitry and/or logic. The delay time introduced to the $2f_{in}$ signal by the delay section 66 creates a delayed signal on line 80 that is input to one input of the X-OR gate 68.

The delay section 66 and the X-OR gate 68 collectively form a second frequency multiplier unit for the $2f_{in}$ signal. The frequency multiplier unit is operable to multiply the frequency of the $2f_{in}$ signal by an integer or whole number. In the present case, the frequency multiplier unit is operable to provide a signal that is twice or two times (2×) the input signal $2f_{in}$ ($4f_{in}$ or $4\times f_{in}$). The delay factor or tau ($\tau$) of the delay section 66 is typically chosen to be T/2 where T is the period of twice the input signal $2f_{in}$. This creates a 50% duty cycle signal.

The $2f_{in}$ signal from the X-OR gate 64 is input to one input of a multiplexer 72 while the $4f_{in}$ signal from the X-OR gate 68 is input to another input of the multiplexer 72. The multiplexer 72 is operable to provide at its output either one of the two signals at the inputs to the multiplexer 72 depending on a multiplexer control or select signal. A multiplexer select signal of one state will provide the $2f_{in}$ signal to the output of the multiplexer 72, while a multiplexer select signal of another state will provide the $4f_{in}$ signal to the output of the multiplexer 72. The output of the multiplexer 72 may be toggled between the two inputs as necessary by the state of the multiplexer select signal. The output signal from the multiplexer 72, which is either $2f_{in}$ or $4f_{in}$ is controlled by a counter 70. In particular, the counter 70 provides a signal to the multiplexer 72 at an appropriate time to toggle or switch the output of the multiplexer 72 between the $2f_{in}$ signal and the $4f_{in}$ signal. The appropriate time that the counter 70 provides a toggle signal to the multiplexer 72 is calculated as presented above and is dependent on the desired frequency of the output signal. The desired frequency of the output signal is between the frequency of the input signal $2f_{in}$ and the frequency of the $4f_{in}$ signal. The resulting output signal of the multiplexer 72 is input to a clock distribution buffer 74. The output of the buffer 74 is the output signal, $f_{out}$.

The counter 70 is clocked by the $4f_{in}$ signal as output by the two-input X-OR gate 68. When the counter 70 reaches a predetermined clock count, the counter 70 provides a toggle signal to the multiplexer 72. The multiplexer 72 then provides either the $2f_{in}$ signal or the $4f_{in}$ signal to the buffer 74. When the counter 70 again reaches a predetermined clock count, the counter 70 provides a toggle signal to the multiplexer 72. The multiplexer 72 then provides the other of the $2f_{in}$ signal or the $4f_{in}$ signal to the buffer 74. This toggling of the multiplexer 72 occurs as necessary to provide an output signal of the required frequency by the appropriate combining of the input signal $2f_{in}$ and the $4f_{in}$ signal.

Adding another frequency multiplier unit would allow the output signal $f_{out}$ to be between $4f_{in}$ and $8f_{in}$. Adding another frequency multiplier unit would allow the output signal $f_{out}$ to be between $8f_{in}$ and $16f_{in}$. In this manner, a high frequency output signal may be synthesized without having to provide a high frequency input signal.

While this invention has been described as having a preferred design and/or configuration, the present invention can be further modified within the spirit and scope of this disclosure.

What is claimed is:

1. A digital frequency multiplier comprising:
   frequency multiplying means for receiving an input signal of a given frequency and generating an intermediate signal of a frequency that is an integer multiple of the given frequency of the input signal;
   signal selection means in communication with the frequency multiplying means for receiving the input signal and the intermediate signal and selectively outputting the input signal for a first predetermined period of time and the intermediate signal for a second predetermined period of time in response to a control signal to generate an output signal having a frequency that is a non-integer multiple of the given frequency of the input signal; and
   control means in communication with the signal selection means for generating the control signal and operable for providing the control signal to the signal selection means, said control means being adapted to receive said intermediate signal and to generate said control signal in response thereto to said signal selection means so that said control means generates a control signal for an appropriate number of clock cycles for both said input signal and for said intermediate signal.

2. The digital frequency multiplier of claim 1, wherein the control means generates the control signal based on a predetermined non-integer multiplication factor that is equal to the non-integer multiple of the output signal.

3. The digital frequency multiplier of claim 2, wherein the control signal comprises a signal of a first state and a signal of a second state, wherein the signal of the first state causes the signal selection means to output one of the intermediate signal and the input signal, and the signal of the second state causes the signal selection means to output the other of the intermediate signal and the input signal.

4. The digital frequency multiplier of claim 3, wherein the signal of a first state is provided to the signal selection means for a first predetermined period of time, and the signal of the second state is provided to the signal selection means for a second predetermined period of time.

5. The digital frequency multiplier of claim 2, wherein the selection means is a multiplexer.

6. The digital frequency multiplier of claim 2, wherein the control means is a counter.

7. The digital frequency multiplier of claim 6, wherein the counter is clocked by the intermediate signal.

8. A digital frequency multiplier comprising:
   a frequency multiplier unit operable to generate an intermediate signal having a frequency that is an integer multiple of a frequency of an input signal;
   a multiplexer having a first input in communication with the frequency multiplier unit and operable to receive the intermediate signal, and a second input operable to receive the input signal, the multiplexer configured to output the intermediate signal for a predetermined period of time in response to a control signal of a first state, and output the input signal for a predetermined period of time in response to a control signal of a second state, wherein the selective outputting of the intermediate signal and the input signal results in an output signal of a frequency that is a non-integer multiple of the input signal; and
   a control signal generator in communication with the multiplexer and operable to generate the control signal of the first state and the control signal of the second state, said control signal generator being adapted to receive said intermediate signal and to generate said control signal in response thereto for said signal selection means so that said control means generates a control signal for an appropriate number of clock cycles for both said input signal and for said intermediate signal.

9. The digital frequency multiplier of claim 8, wherein the integer multiple is two and the non-integer frequency of the output signal is greater than the given frequency of the input signal and less than the frequency of the intermediate signal.

10. The digital frequency multiplier of claim 8, wherein the frequency multiplier unit comprises a delay section and an exclusive OR gate.

11. The digital frequency multiplier of claim 8, wherein the control signal generator is a counter clocked by the intermediate signal.

12. The digital frequency multiplier of claim 11, wherein the counter alternatively generates and provides to the multiplexer the control signal of a first state and the control signal of a second state each time the counter reaches a predetermined count based on the clocking of the intermediate signal.

13. The digital frequency multiplier of claim 12, wherein the non-integer multiple of the output signal determines the predetermined count.

14. A method of generating an output signal of a frequency that is a non-integer multiple of a frequency of an input signal comprising:
   digitally generating an intermediate signal of a frequency that is an integer multiple of the frequency of the input signal;
   determining a first number of clock cycles of the input signal and a second number of clock cycles of the intermediate signal that, when combined, generate an output signal of a frequency that is the non-integer multiple of the frequency of the input signal;
   digitally generating a control signal indicative of the first number of clock cycles and the second number of clock cycles, said control signal being generated in response to receipt of said intermediate signal so that said control signal is generated for an appropriate number of clock cycles for both said input signal and for said intermediate signal; and
   digitally selectively outputting the input signal for the first number of clock cycles and the intermediate signal for the second number of clock cycles in response to the control signal, whereby the selective outputting of the input signal and the intermediate signal results in an output signal of a frequency that is a non-integer multiple of the frequency of the input signal.

15. The method of claim 14, wherein digitally generating an intermediate signal of a frequency that is an integer multiple of the frequency of the input signal comprises:

introducing a delay factor to the input signal to produce a delayed signal; and exclusive OR'ing the delayed signal with the input signal.

16. The method of claim 15, wherein the integer multiple is two.

17. The method of claim 14, wherein digitally generating a control signal indicative of the first number of clock cycles and the second number of clock cycles comprises:

clocking a digital counter with the intermediate signal; and setting the counter to provide the control signal upon reaching a predetermined count value.

18. The method of claim 17, wherein the control signal comprises:

a signal of a first state to select the intermediate signal and a signal of a second state to select the input signal.

19. The method of claim 14, wherein digitally selectively outputting the input signal for the first number of clock cycles and the intermediate signal for the second number of clock cycles in response to the control signal comprises:

inputting the input signal to a multiplexer;

inputting the intermediate signal to the multiplexer; and providing the control signal to the multiplexer.

20. The method of claim 14, wherein determining a first number of clock cycles of the input signal and a second number of clock cycles of the intermediate signal comprises:

simultaneously solving:

$$f_{out} = k1 * (f_{in}) + k2 * (2f_{in}); \text{ and}$$

$$k1 + k2 = 1;$$

where $f_{out}$ is the output signal, $f_{in}$ is the input signal, k1 is the number of clock cycles of one of the input signal and the intermediate signal ($2f_{in}$), and k2 is the number of clock cycles of the other of the input signal and the intermediate signal.

* * * * *